United States Patent
Killian et al.

(10) Patent No.: US 6,972,613 B2
(45) Date of Patent: Dec. 6, 2005

(54) FUSE LATCH CIRCUIT WITH NON-DISRUPTIVE RE-INTERROGATION

(75) Inventors: Michael A. Killian, Richmond, VT (US); Nicholas M. van Heel, Eagle, ID (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/657,362

(22) Filed: Sep. 8, 2003

(65) Prior Publication Data

US 2005/0052218 A1    Mar. 10, 2005

(51) Int. Cl.[7] .................... H01H 37/76; G11C 7/00
(52) U.S. Cl. .................... 327/525; 365/200; 365/225.7
(58) Field of Search ............... 327/525, 526, 327/199; 365/225.7, 200, 189.05

(56) References Cited

U.S. PATENT DOCUMENTS

| | | | | |
|---|---|---|---|---|
| 5,345,110 A | * | 9/1994 | Renfro et al. | 327/199 |
| 5,619,469 A | * | 4/1997 | Joo | 365/225.7 |
| 5,723,999 A | * | 3/1998 | Merritt | 327/526 |
| 5,905,687 A | | 5/1999 | Brede et al. | 365/222 |
| 6,016,265 A | | 1/2000 | Yoshida et al. | 365/96 |
| 6,191,984 B1 | * | 2/2001 | Noh | 365/200 |
| 6,384,666 B1 | * | 5/2002 | Bertin et al. | 327/525 |
| 6,552,946 B2 | * | 4/2003 | Yokozeki | 365/225.7 |
| 6,707,746 B2 | * | 3/2004 | Frankowsky et al. | 365/225.7 |
| 6,728,148 B2 | * | 4/2004 | Yamauchi | 365/200 |

* cited by examiner

*Primary Examiner*—Minh Nguyen
(74) *Attorney, Agent, or Firm*—Slater & Matsil, L.L.P.

(57) ABSTRACT

Information concerning a condition of a fuse is stored in a latch circuit and may be corrected. A first signal is supplied to the latch circuit which sets the latch circuit in a first state when the fuse is in a first condition and keeps the latch circuit unchanged when the fuse is in a second condition. While the first signal is being supplied, a second signal is supplied to the latch circuit that keeps the latch circuit in the first state when the fuse is in the first condition and sets the latch circuit in a second state when the fuse is in the second condition.

24 Claims, 1 Drawing Sheet

FUSE LATCH CIRCUIT WITH NON-DISRUPTIVE RE-INTERROGATION

BACKGROUND OF THE INVENTION

The present invention is directed to electronic devices and, more particularly, to repairable electronic devices that include redundant regions for replacing defective regions of the device, such as the cells of a semiconductor memory devices.

Semiconductor memory devices, such as dynamic random access memory devices (DRAMs), typically include a semiconductor memory cell array formed of a plurality of memory cells arranged in rows and columns and include a plurality of bit lines as well as a plurality of word lines that intersect the bit lines. Each memory cell of the array is located at the intersection of a respective word line and a respective bit line and includes a capacitor for storing data and a transistor for switching, such as a planar or vertical MOS transistor. The word line is connected to the gate of the switching transistor, and the bit line is connected to the source or drain of the switching transistor. When the transistor of the memory cell is switched on by a signal on the word line, a data signal is transferred from the capacitor of the memory cell to the bit line connected to the memory cell or from the bit line connected to the memory cell to the capacitor of the memory cell.

When data stored in one of the memory cells is read onto one of the bit lines, for example, a potential difference is generated between the bit line of the respective memory cell and the bit line of another memory cell which form a bit line pair. A bit line sense amplifier connected to the bit line pair senses and amplifies the potential difference and transfers the data from the selected memory cells to a data line pair.

As the capacity of semiconductor memory devices increases, the likelihood that a device includes one or more defective memory cells also increases, thereby adversely affecting the yield of the semiconductor memory device manufacturing processes. To address this problem, redundant memory cells are provided which can replace memory cells that are found to be defective during device testing. Typically, one or more spare rows, known as row redundancy, and/or one or more spare columns, known as column redundancy, are included in the memory cell array. The spare rows and/or columns have programmable decoders that can be programmed to respond to the address of the defective row and/or column while at the same time disabling the selection of the defective cell. The address of the defective memory cell is programmed into the fuse programmable decoder by blowing one or more appropriate fuses in a redundancy control circuit. When an address corresponding to a defective memory cell is received, the redundant memory cell is selected so that part or all of the word line or bit line that is connected to the redundant memory cell is substituted for the corresponding portion of a word line or bit line of entire word line or bit line that contains the defective memory cell. As a result, the repaired memory device chip cannot be readily distinguished, at least electrically, from a defect-free chip.

To read the address of the defective memory cell stored in the fuses, at least one fuse latch is required to read and store the state of each fuse. In a known redundancy arrangement, a plurality of fuses are programmed to represent the respective bits of fail addresses by defining one of a 0 or 1 value as a fuse in a blown or open state and the other of the 0 and 1 values as a fuse in an unblown or shorted state. Each of the fuses is connected to a terminal of its corresponding fuse latch circuit, and a pre-charge line bPUP and a readout strobe PUN are respectively connected to other inputs of each circuit. During power-up, a signal delivered on the pre-charge line bPUP initializes the values stored in each of the fuse latch circuits. Then, when the readout strobe line PUN is activated, the value stored in the fuse is read into its corresponding fuse latch.

A known source of failure in semiconductor devices is the generation of electron-hole pairs caused by cosmic rays or other ionizing radiation. In a DRAM device, the generation of the electron-hole pairs can change the voltage stored in a memory cell so that a stored "0" value may be changed to a "1" or a stored "1" may be changed to a "0" and thus, the value read out from the DRAM is altered. Such errors in a memory cell of a DRAM are usually present only for a short time, however, because the effected cell is typically rewritten or reset by a subsequent memory cell access.

A more permanent error is introduced into a DRAM device when the electron-hole pairs are generated in a fuse latch circuit and changes the state of the latch. Typically, the state of the fuse latch is determined when the DRAM device is powered on and is not rewritten or reset while the DRAM remains on. Any errors introduced into the value stored for the fuse latch circuits remain until the device is powered down and subsequently powered on. As a result, the fail address stored by a redundancy circuit that has a corrupted fuse latch may be changed, and a defective bit line is accessed until the DRAM is powered down.

To avoid the possibility of an incorrect fail address value remaining stored in the redundancy fuse latches, the fuse latch circuitry may re-interrogate the fuses periodically to refresh the states of the fuse latches. At predetermined intervals, a signal is delivered over the pre-charge line bPUP and re-initializes the value stored in each of the fuse latch circuits. Then a further signal is delivered over the readout strobe line PUN, and the values stored in the fuses are read into the fuse latches. During this interval, however, the data stored in the memory cells cannot be accessed. Thus, the speed and performance of the DRAM device is degraded.

It is therefore desirable to be able to periodically re-interrogate the fuses to correct the values stored in corrupted fuse latches without interfering with access to the output of the fuse latches.

SUMMARY OF THE INVENTION

The present invention provides for the re-interrogation of the state of the fuse and the storage of the corresponding value within a fuse latch while the DRAM circuit remains accessible.

In accordance with an aspect of the invention, information concerning a condition of a fuse is stored in a latch circuit. A first signal is supplied to the latch circuit and sets the latch circuit in a first state when the fuse is in a first condition and keeps the latch circuit unchanged when the fuse is in a second condition. While the first signal is being supplied, a second signal is supplied to the latch circuit that keeps the latch circuit in the first state when the fuse is in the first condition and sets the latch circuit in a second state while the fuse is in the second condition.

According to another aspect of the invention, an error in information stored in a latch circuit concerning a condition of a fuse is corrected in the manner set out above.

According to a further aspect of the invention, information concerning a condition of a fuse is stored in a latch circuit. The latch circuit includes a pair of inverter circuits, a first transistor and a second transistor. The pair of inverter circuits is connected in anti-parallel with a common input terminal and a common output terminal. The first transistor has a first terminal that is coupled to the input terminal of the pair of inverter circuits, a further terminal that is coupled to a further terminal of the fuse, and a gate terminal that is coupled to a strobe line. The second transistor has a first terminal that is coupled to a supply voltage, a further terminal that is coupled to the further terminal of the fuse and to the further terminal of the first transistor, and a gate terminal that is coupled to a pre-charge line. A first signal is supplied on the strobe line that activates the first transistor thereby setting the input terminal of the pair of inverter circuits at a first voltage when the fuse is in a first condition and keeping a voltage state of the input terminal of the pair of inverter circuits unchanged when the fuse is in a second condition. A second signal is supplied on a pre-charge line while the first signal is supplied on the strobe line. The second signal activates the second transistor thereby keeping the input terminal of the pair of inverter circuits in the first voltage state when the fuse is in the first condition and setting the input terminal of the pair of inverter circuits at a second voltage when the fuse is in the second condition.

According to a still further aspect of the invention, an error in information stored in a latch circuit turning a condition of a fuse is corrected in the above manner.

According to yet another aspect of the invention, a latch circuit includes a device operable to remain in one of at least the first state and a second state. The first input is operable to receive a first signal which sets the device in the first state when the fuse is in a first condition and keeps a state of a device unchanged when the fuse is in a second condition. A second input is operable to receive a second signal, while the first signal is being supplied to the first input, that keeps the device in the first state when the fuse is in the first condition and sets the device in the second state when the fuse is in the second condition.

According to still another aspect of the invention, a latch circuit reads, stores and outputs information concerning a condition of a fuse. The fuse has a first terminal coupled to a ground potential. A pair of inverter circuits is connected in anti-parallel and has a common input terminal and a common output terminal. A first transistor has a first terminal coupled to the input terminal of the pair of inverter circuits, a further terminal coupled to a further terminal of the fuse, and a gate terminal coupled to a strobe line. A second transistor has a first terminal coupled to a supply voltage, a further terminal coupled to the further terminal of the fuse and to the further terminal of the first transistor, and a gate terminal coupled to a pre-charge line. The first transistor, when activated by a signal delivered by the strobe line, sets the input terminal of the pair of inverter circuits at a lower voltage when the fuse is intact and keeps a voltage state of the input terminal of the pair of inverter circuits unchanged when the fuse is blown. The second transistor, when activated by a signal delivered by the pre-charge line while the signal is being delivered by the strobe line, keeps the input terminal of the pair of inverter circuits at lower voltage when the fuse is intact and sets the input terminal of the pair of inverter circuits at a higher voltage when the fuse is blown.

The foregoing aspects, features and advantages of the present invention will be further appreciated when considered with reference to the following description of the preferred embodiments and accompanying drawings.

DETAILED DESCRIPTION

Figure 1:
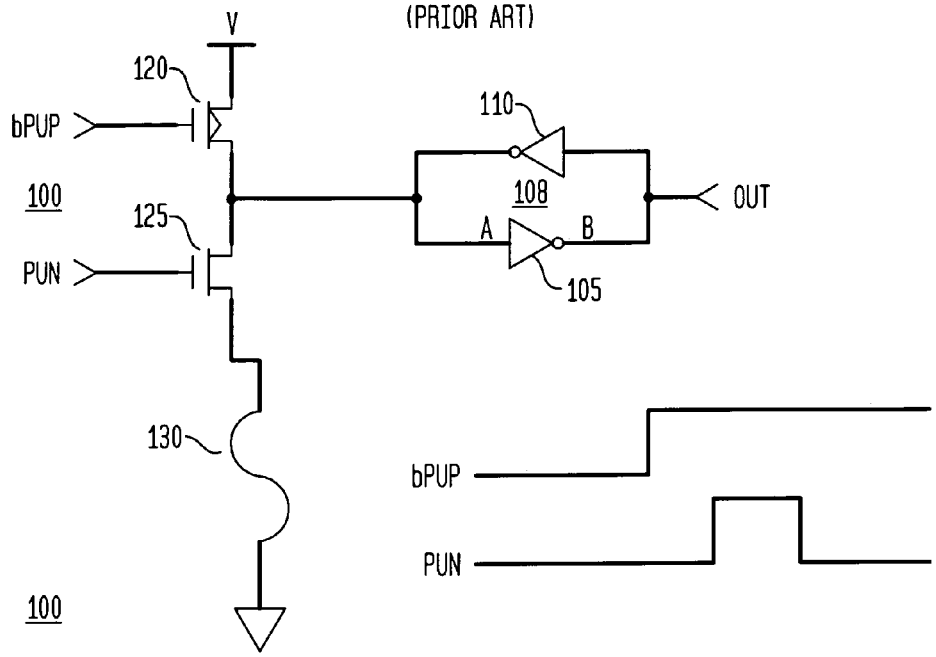
FIG. 1 is a schematic diagram showing a known arrangement for a fuse and fuse latch circuit.

FIG. 1 illustrates a known fuse latch circuit 100, such as is used in the redundancy architecture of a DRAM device. A fuse 130 is programmable to represent a fail address bit by defining one of a 0 or 1 value as a fuse in a blown or open state and the other of the 0 and 1 values as a fuse in an unblown or shorted state. The fuse 130 is connected between a ground terminal and a terminal of an n-channel transistor 125. Another terminal of the n-channel transistor 125 is coupled to an input A of a pair 108 of inverter circuits 105, 110 that are arranged in an anti-parallel configuration. A gate terminal of the transistor 125 is connected to a readout strobe input PUN.

A terminal of a p-channel transistor 120 is connected to a supply voltage V, and another terminal of the p-channel transistor 120 is also connected to the terminal of the n-channel transistor 125 and to the input of the inverter pair 108. A pre-charge line bPUP is connected to a gate of the p-channel transistor 120.

During power-up of the DRAM, the pre-charge line bPUP is initially held at a low voltage state and activates the transistor 120 to provide a connection between the inverter pair 108 and the supply voltage which pre-charges the inverter pair 108. After a preset interval, the pre-charge line bPUP is raised and held at a high voltage state.

Next, the readout strobe line PUN, which is initially held at a low voltage state, is raised to a high voltage state for a predefined interval to activate the transistor 125 and provide a connection between the pre-charge inverter pair 108 and the fuse 130. When the fuse 130 is in an unblown or shorted state, the charge stored in the inverter pair 108 is discharged through the fuse 130 to the ground terminal and inverts the state of the output OUT. Alternatively, when the fuse 130 is in a blown or open state, the charge stored in the inverter pair is not discharged through the fuse 130, and the output OUT of the inverter pair 108 remains in its original state.

Thereafter, the readout strobe line PUN changes from the high voltage state back to the low voltage state and interrupts the connection across the terminals of the transistor 125 so that the output OUT remains in its current state.

The known fuse latch circuit interrogates the fuse and is latched only when the DRAM device is powered on so that the value stored in the latch circuit is not rewritten or reset until the DRAM is shut down and restarted. Therefore, when a fault occurs in the latch circuit, such as the generation of electron-hole pairs, that causes the fuse latch to change states, the fuse latch circuit stores the corrupted value for as long as the DRAM remains powered on, so that the latch outputs an incorrect bit value.

Moreover, though it is possible to refresh and relatch the fuse latch circuit while the DRAM remains powered on, the fuse latch circuit is unavailable during this interval.

The present invention provides a fuse latch circuit which permits the fuse latches to re-interrogate the fuses without requiring that the fuse latches are first re-initialized. The fuse latches are therefore always available for data access.

Figure 2:
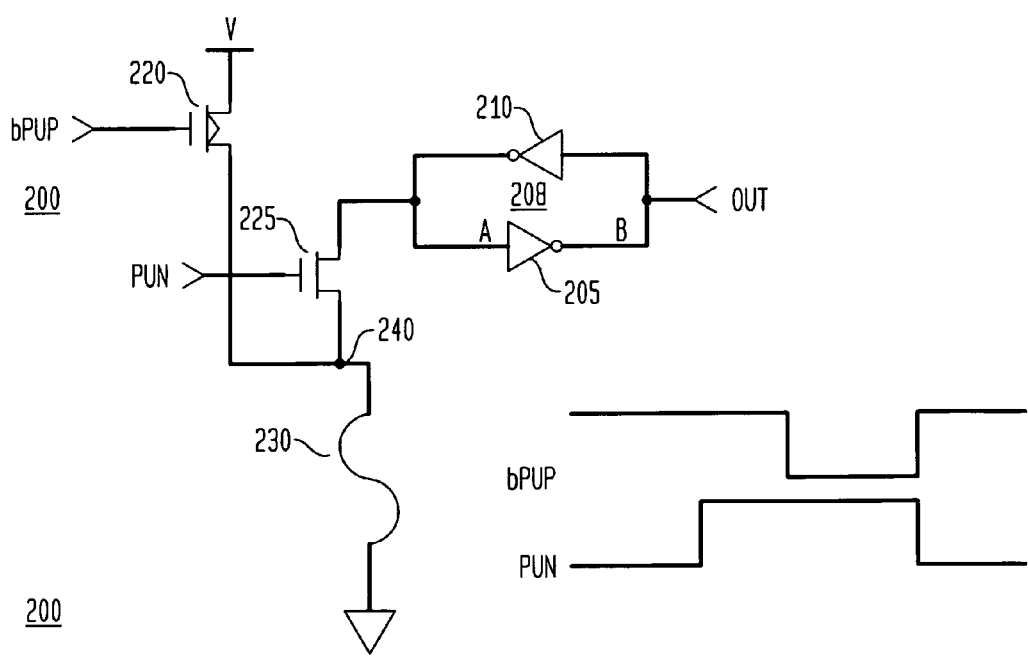
FIG. 2 is a schematic diagram showing an arrangement of a fuse and fuse latch circuit in accordance with an embodiment of the invention.

FIG. 2 is a schematic diagram showing an arrangement of a fuse latch circuit 200 in accordance with an embodiment of the invention. A fuse 230 is programmable to represent a fail address bit and is connected between a ground terminal and a terminal of an n-channel transistor 225. Another terminal of the n-channel transistor 225 is coupled to an input of an inverter pair 208 formed of an anti-parallel configured pair of inverter circuits 205, 210. A gate terminal of the transistor 225 is connected to the readout strobe input PUN.

A terminal of a p-channel transistor 220 is connected to a supply voltage V. Another terminal of the p-channel transistor 220, however, is connected to the terminal of the n-channel transistor 225 and the fuse 230 at a node 240, rather than being connected to the n-channel transistor and to the input of the inverter pair as shown in FIG. 1. A pre-charge line bPUP is connected to a gate of the p-channel transistor 220.

The modified arrangement of the fuse latch circuit 200 of the invention permits the fuse latch circuit to re-interrogate the fuse without first re-initializing the fuse latch circuit. First, the readout strobe line PUN, which is initially at a low voltage state, is raised to a high voltage state and held there for a predetermined interval. While the PUN signal is held high, the pre-charge line bPUP, which is initially at a high voltage state, is brought down to a low voltage state for the remainder of the interval. Thereafter, the PUN line and the bPUP line are concurrently returned to their original states.

The arrangement of the fuse latch circuit 200 together with the above signaling sequence enables the correction of any erroneous values stored by the fuse latch circuit. When the fuse 230 is in an unblown or shorted state and the readout strobe line PUN is raised to the high voltage state, the n-channel transistor 225 is activated and closes a connection from the node A of the inverter pair 208 across the intact fuse 230 to the ground terminal. The node A is then connected to the ground potential. Ordinarily, when the fuse latch circuit 200 has previously interrogated the fuse and no errors have been introduced into the inverter pair 208, the node A is already at the ground potential and is unchanged. However, when an error has been introduced, such as by the generation of an electron-hole pair, that has raised the voltage at node A, the node A is now returned to the ground potential and correct any stored errors.

Then, while the readout strobe PUN remains high, the pre-charge line bPUP is changed to a low voltage state which activates the p-channel transistor 220 and provides a connection between the supply voltage and the node 240. However, the state of the node A is not affected though the n-channel transistor 225 remains activated, because of the low resistance of the unblown or shorted fuse 230 which forces the node 240 down to ground potential.

Thereafter, the readout strobe line PUN is returned to the low voltage state which deactivates the n-channel transistor 225 and isolates node A at the ground potential. At the same time, the pre-charge line bPUP is returned to the high voltage state to deactivate the p-channel transistor 220.

Alternatively, when the fuse 230 is in a blown or open state and the readout strobe line PUN is raised to the high voltage state and activates the n-channel transistor 225, the state of the node A is unchanged because the deactivated p-channel transistor 220 isolates the node A from the supply voltage and the blown fuse 230 isolates the node A from the ground voltage. Then, while the readout strobe line PUN remains in the high voltage state and the n-channel transistor 225 remains open, the pre-charge line bPUP changes from the high voltage state to the low voltage state. The p-channel transistor 220 is thereby activated and provides a connection from the supply voltage V to the node 240 and then across the n-channel transistor 225 to the node A. Ordinarily, when the fuse latch circuit 200 has previously interrogated the fuse 230 and no errors are present, the node A is already at the supply voltage. However, when an error is introduced into the inverter pair 208 is first at a lower voltage or at ground potential and is raised to the supply voltage. As a result, any errors introduced into the inverter pair 208 are now corrected.

Thereafter, the readout strobe line PUN is returned to the low voltage state, and concurrently, the pre-charge line bPUP is returned to the high voltage state, thereby deactivating the n-channel transistor 225 and the p-channel transistor 220 and isolating the node A so that the node A remains at the supply voltage. As a result, when the fuse latch circuit 200 is next read, the output OUT supplies the correct output value.

Advantageously, the state of the inverter pair of the fuse latch circuit is modified only when the information stored therein contains an error. Moreover, the fuse latch circuit can re-interrogate the fuse at any time while the DRAM device is operating. Additionally, the fuse latch circuit can re-interrogate the fuse without delaying access to the output of the fuse latch circuit.

The fuse latch circuit can also re-interrogate at regular, predetermined intervals. Alternatively, the fuse latch circuit of the invention may re-interrogate the fuse at arbitrary or random intervals.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of storing, in a latch circuit, information concerning a condition of a fuse; said latch circuit comprising a pair of inverter circuits, a first transistor, and a second transistor; said pair of inverter circuits being connected in anti-parallel with a common input terminal and a common output terminal; said first transistor having a first terminal coupled to said input terminal of said pair of inverter circuits, a further terminal coupled to a further terminal of said fuse, and a gate terminal coupled to a strobe line; and said second transistor having a first terminal coupled to a supply voltage, a further terminal connected to said further terminal of said fuse and to said further terminal of said first transistor, and a gate terminal coupled to a pre-charge line; said method comprising:

supplying a first signal on said strobe fine that activates said first transistor thereby setting said input terminal of said pair of inverter circuits at a first voltage state when said fuse is in a first condition and keeping a voltage state of said input terminal of said pair of inverter circuits unchanged when said fuse is in a second condition; and supplying a second signal on said pre-charge line while said first signal is being supplied on said strobe line, said second signal activating said second transistor thereby keeping said input terminal of said pair of inverter circuits in said first voltage state when said fuse is in said first condition and setting said input terminal of said pair of inverter circuits at a second voltage state when said fuse is in said second condition.

2. The method of claim 1 wherein said fuse is in said first condition when said fuse is intact, and said fuse is in said second condition when said fuse is blown.

3. The method of claim 1 wherein said first signal is initiated by a change from a lower voltage to a higher voltage, and said first transistor is an n-channel transistor.

4. The method of claim 1 wherein said second signal is initiated by a change from a higher voltage to a lower voltage, and said second transistor is a p-channel transistor.

5. The method of claim 1 wherein said first voltage state comprises a lower voltage and said second voltage state comprises a higher voltage.

6. The method of claim 1 further comprising terminating said first signal and said second signal concurrently.

7. A method of correcting an error in information stored in a latch circuit concerning a condition of a fuse; said latch circuit comprising a pair of inverter circuits, a first transistor, and a second transistor; said pair of inverter circuits being connected in anti-parallel with a common input terminal and a common output terminal; said first transistor having a first terminal coupled to said input terminal of said pair of inverter circuits, a further terminal coupled to a further terminal of said fuse, and a gate terminal coupled to a strobe line; and said second transistor having a first terminal coupled to a supply voltage, a further terminal connected to said further terminal of said fuse and to said further terminal of said first transistor, and a gate terminal coupled to a pry-charge line; said method comprising:
 supplying a first signal on said strobe line that activates said first transistor thereby setting said input terminal of said pair of inverter circuits at a first voltage state when said fuse is in a first condition and keeping a voltage state of said input terminal of said pair of inverter circuits unchanged when said fuse is in a second condition; and
 supplying a second signal on said pre-charge line while said first signal is being supplied on said strobe line, said second signal activating said second transistor thereby keeping said input terminal of said pair of inverter circuits in said first voltage state when said fuse is in said first condition and setting said input terminal of said pair of inverter circuits at a second voltage state when said fuse is in said second condition.

8. The method of claim 7 wherein said fuse is in said first condition when said fuse is intact, and said fuse is in said second condition when said fuse is blown.

9. The method of claim 7 wherein said first signal is initiated by a change from a lower voltage to a higher voltage, and said first transistor is an n-channel transistor.

10. The method of claim 7 wherein said second signal is initiated by a change from a higher voltage to a lower voltage, and said second transistor is a p-channel transistor.

11. The method of claim 7 wherein said first voltage state comprises a lower voltage and said second voltage state comprises a higher voltage.

12. The method of claim 7 further comprising terminating said first signal and said second signal concurrently.

13. A latch circuit for reading, holding and outputting information concerning a condition of a fuse, said fuse having a first terminal coupled to a ground potential, said circuit comprising:
 a pair of inverter circuits connected in an anti-parallel arrangement and with a common input terminal and a common output terminal;
 a first transistor having a first terminal coupled to said input terminal of said pair of inverter circuits, a further terminal coupled to a further terminal of said fuse, and a gate terminal coupled to a first signal line; and
 a second transistor having a first terminal coupled to a supply voltage, a further terminal connected to said further terminal of said fuse and to said further terminal of said first transistor, and a gate terminal coupled to a second signal line;
 said first transistor, when activated by a first signal delivered by said first signal line, setting said input terminal of said pair of inverter circuits at a first voltage when said fuse is in a first condition and keeping a voltage state of said input terminal of said pair of inverter circuits unchanged when said fuse is in a second condition;
 said second transistor, when activated by a second signal delivered by said second signal line while said first signal is being delivered by said first signal line, keeping said input terminal of said pair of inverter circuits at said first voltage when said fuse is in said first condition and setting said input terminal of said pair of inverter circuits at a second voltage when said fuse is in said second condition.

14. The latch circuit of claim 13 wherein said fuse is in said first condition when said fuse is intact, and said fuse is in said second condition when said fuse is blown.

15. The latch circuit of claim 13 wherein said first state comprises a lower voltage and said second state comprises a higher voltage.

16. The latch circuit of claim 13 wherein said first signal line comprises a strobe signal line.

17. The latch circuit of claim 13 wherein said second signal line comprises a precharge signal line.

18. The latch circuit of claim 13 wherein said first transistor is an n-channel transistor.

19. The latch circuit of claim 13 wherein said second transistor is a p-channel transistor.

20. A latch circuit for reading, holding and outputting information concerning a condition of a fuse, said fuse having a first terminal coupled to a ground potential, said circuit comprising:
 a pair of inverter circuits connected in an anti-parallel arrangement and with a common input terminal and a common output terminal;
 a first transistor baying a first terminal coupled to said input terminal of said pair of inverter circuits, a further terminal coupled to a further terminal of said fuse, and a gate terminal connected to a first signal line; and
 a second transistor having a first terminal coupled to a supply voltage, a further terminal coupled to said further terminal of said fuse and to said further terminal of said first transistor, and a gate terminal coupled to a second signal line.

21. The latch circuit of claim 20,
 wherein said first transistor, when activated by a first signal delivered by said first signal line, setting said input terminal of said pair of inverter circuits at a first voltage when said fuse is in a first condition and keeping a voltage state of said input terminal of said pair of inverter circuits unchanged when said fuse is in a second condition,
 wherein said second transistor, when activated by a second signal delivered by said second signal line while said first signal is being delivered by said first signal line, keeping said input terminal of said pair of inverter circuits at said first voltage when said fuse is in said first condition and setting said input terminal of said pair of inverter circuits at a second voltage when said fuse is in said second condition,
 wherein said fuse is in said first condition when said fuse is intact, and said fuse is in said second condition when said fuse is blown, and wherein said first state comprises a lower voltage and said second state comprises a higher voltage.

22. The latch circuit of claim 20 wherein said first signal line comprises a strobe signal line, and wherein said second signal line comprises a pre-charge signal line.

23. The latch circuit of claim 20 wherein said first transistor is an n-channel transistor, and wherein said second transistor is a p-channel transistor.

24. A fuse latch circuit comprising:
a fuse having a first fuse terminal and a second fuse terminal,
   said first fuse terminal being electrically coupled to a first node, and
   said second fuse terminal being electrically coupled to a ground line;
a p-channel transistor having a gate terminal, a first terminal, and a second terminal,
   said gate terminal of said p-channel transistor being electrically coupled to a pre-charge line,
   said first terminal of said p-channel transistor being electrically coupled to a supply voltage line, and
   said second terminal of said p-channel transistor being connected to said first node;
a pair of inverter circuits connected in an anti-parallel arrangement and having a common input terminal and a common output terminal;
an n-channel transistor having a gate terminal, a first terminal, and a second terminal,
   said gate terminal of said n-channel transistor being electrically coupled to a readout strobe line,
   said first terminal of said n-channel transistor being electrically coupled to said common input terminal of said pair of inverter circuits, and
   said second terminal of said n-channel transistor being electrically coupled to said first node.

* * * * *

UNITED STATES PATENT AND TRADEMARK OFFICE
CERTIFICATE OF CORRECTION

PATENT NO. : 6,972,613 B2
DATED : December 6, 2005
INVENTOR(S) : Killian et al.

It is certified that error appears in the above-identified patent and that said Letters Patent is hereby corrected as shown below:

Column 6,
Line 50, delete "fine" and insert -- line --.

Column 7,
Line 25, delete "pry-charge" and insert -- pre-charge --.

Column 8,
Line 40, delete "baying" and insert -- having --.
Line 45, delete "coupled" and insert -- connected --.

Signed and Sealed this

Twenty-eighth Day of March, 2006

JON W. DUDAS
*Director of the United States Patent and Trademark Office*